United States Patent [19]

Matsuno et al.

[11] Patent Number: 5,106,782
[45] Date of Patent: Apr. 21, 1992

[54] METHOD OF MANUFACTURING A SEMICONDUCTOR DEVICE

[75] Inventors: Tadashi Matsuno, Tokyo; Hideki Shibata, Yokohama; Kazuhiko Hashimoto; Hisayo Momose, both of Tokyo, all of Japan

[73] Assignee: Kabushiki Kaisha Toshiba, Kawasaki, Japan

[21] Appl. No.: 378,627

[22] Filed: Jul. 12, 1989

[30] Foreign Application Priority Data

Jul. 15, 1988 [JP] Japan ................. 63-176723

[51] Int. Cl.$^5$ .......................................... H01L 21/44
[52] U.S. Cl. ..................................... 437/193; 437/34; 437/57; 437/956; 437/984; 148/DIG. 20; 148/DIG. 26; 148/DIG. 102
[58] Field of Search .............. 437/193, 34, 56, 57, 437/147, 953, 48, 52, 195, 187, 203, 194, 956, 984; 148/DIG. 20, DIG. 26, DIG. 102

[56] References Cited

U.S. PATENT DOCUMENTS

| | | | |
|---|---|---|---|
| 4,272,304 | 6/1981 | Komatsu | 437/147 |
| 4,433,468 | 2/1984 | Kawamata | 437/194 |
| 4,512,073 | 4/1985 | Hsu | 437/187 |
| 4,535,532 | 8/1985 | Lancaster | 437/34 |
| 4,549,914 | 10/1985 | Oh | 437/953 |
| 4,686,000 | 8/1987 | Heath | 357/23.6 |

FOREIGN PATENT DOCUMENTS 57-44022  4/1982  Japan .
0116870  2/1986  Japan .

OTHER PUBLICATIONS

Technology for the Fabrication of a 1 MB CMOS Dram, D. S. Yaney et al., AT&T Bell Lab, 1985, IDEM, p. 698.

Primary Examiner—Brian E. Hearn
Assistant Examiner—Tuan Nguyen
Attorney, Agent, or Firm—Finnegan, Henderson, Farabow, Garrett, and Dunner

[57] ABSTRACT

A method of manufacturing a semiconductor device having a semiconductor substrate of a first conductivity type, an N-type diffusion layer formed in the substrate, and a P-type diffusion layer formed in the substrate. Two contact holes are formed in separate steps, thus exposing the N-type diffusion layer and the P-type diffusion layer, respectively. Hence, when one of the diffusion layers is again doped with an impurity, or again heat-treated, the other diffusion layer is already protected by inter-layer insulation film. Therefore, the impurity cannot diffuse into the contact formed in the contact hole made in the other diffusion layer. As a result of this, SAC technique can be successfully achieved, without deteriorating the characteristic of the contact. In addition, since two contact holes are made in a polysilicon wiring strip and the diffusion layer to which the SAC technique is applied, in separate steps, the SAC technique can be successfully accomplished, without deteriorating the characteristic of the MOSFET formed in the semiconductor device.

10 Claims, 6 Drawing Sheets

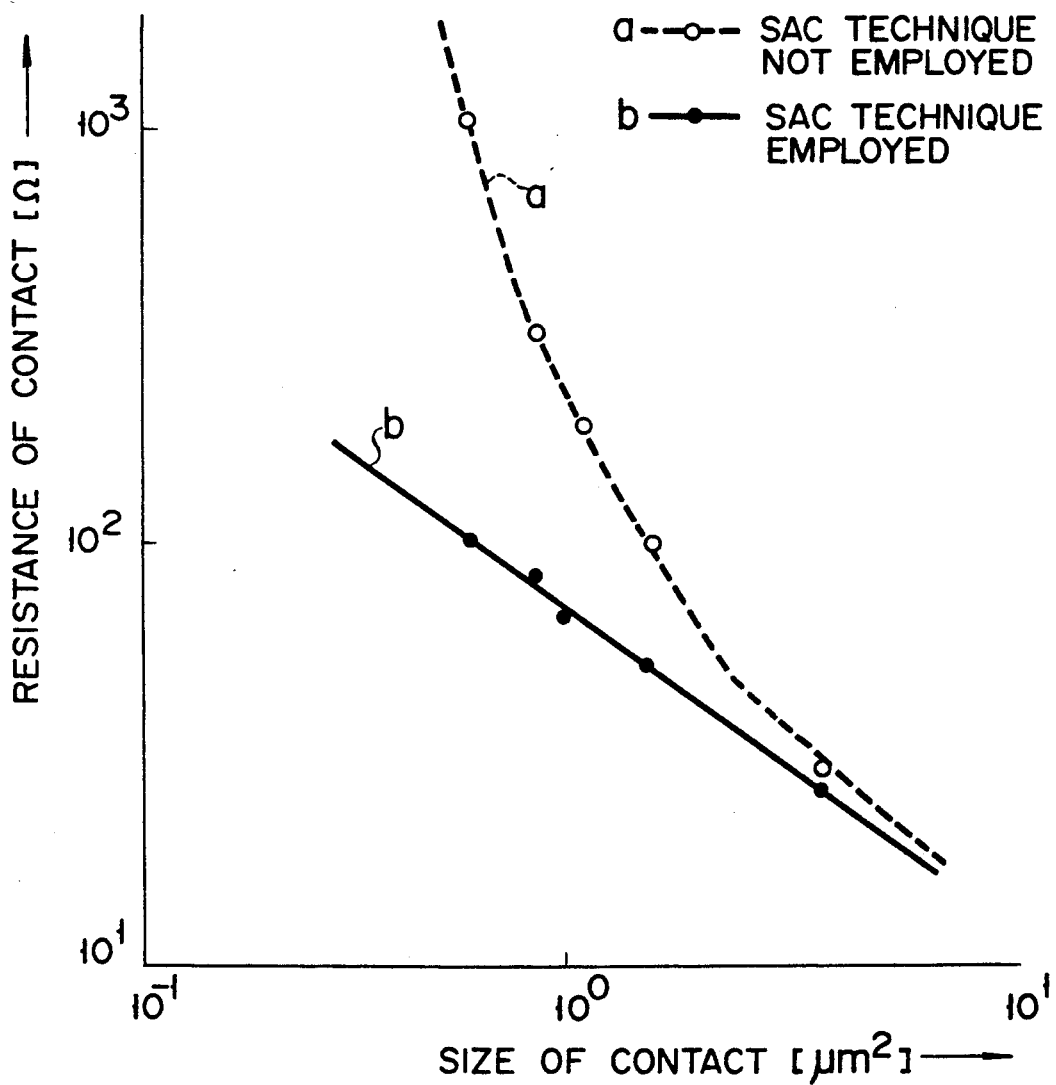
F I G. 1

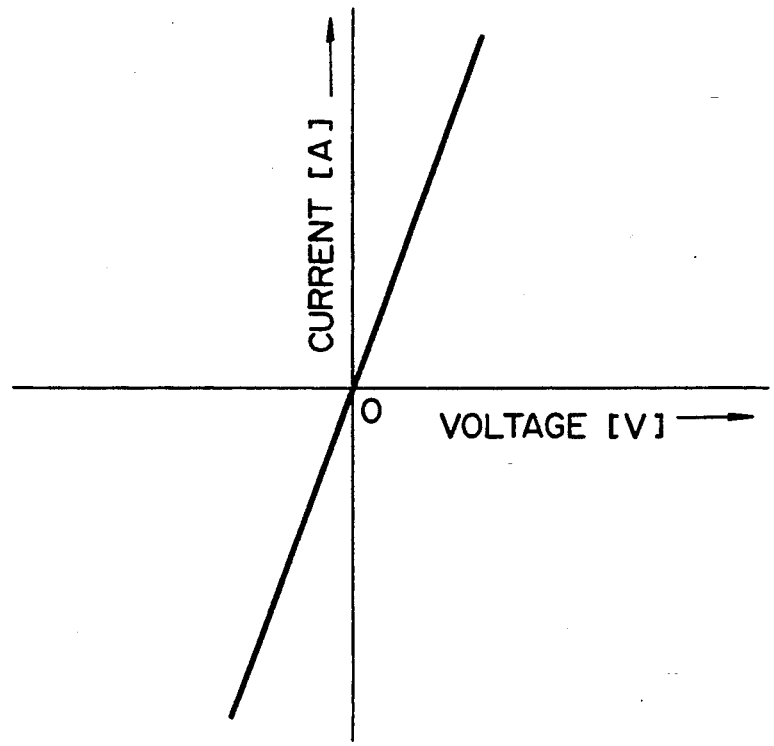
F I G. 2A
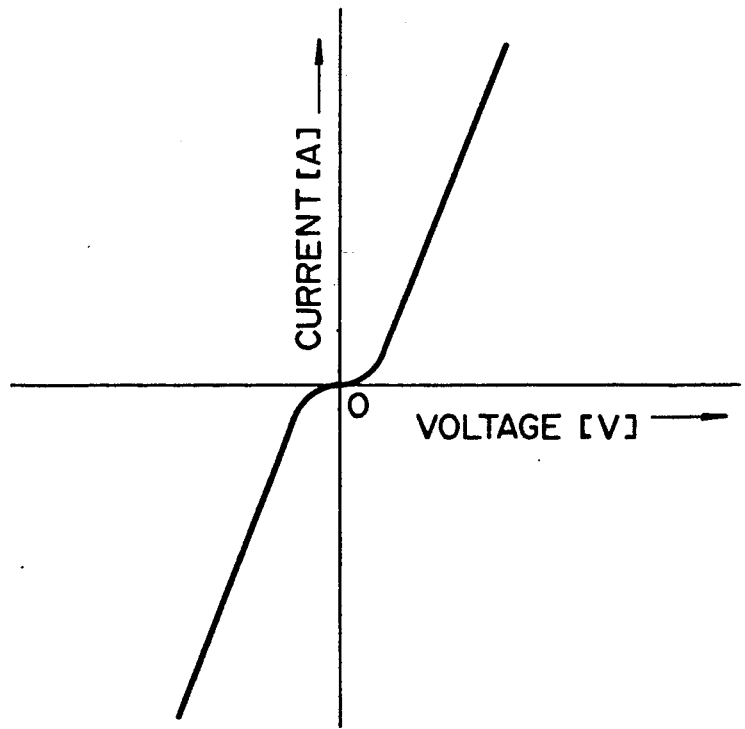
F I G. 2B

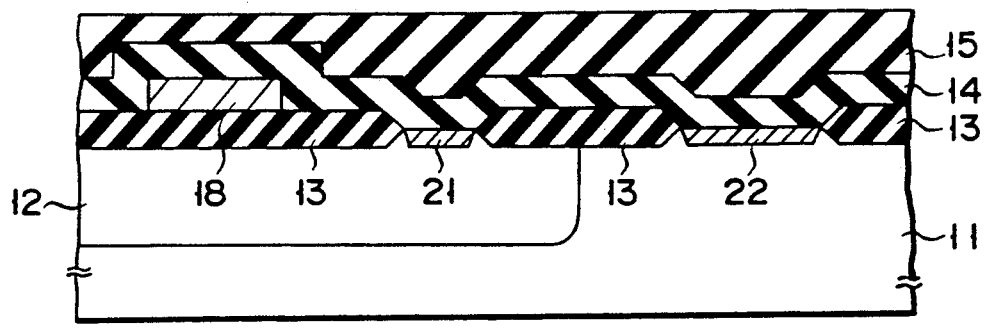
F I G. 3A
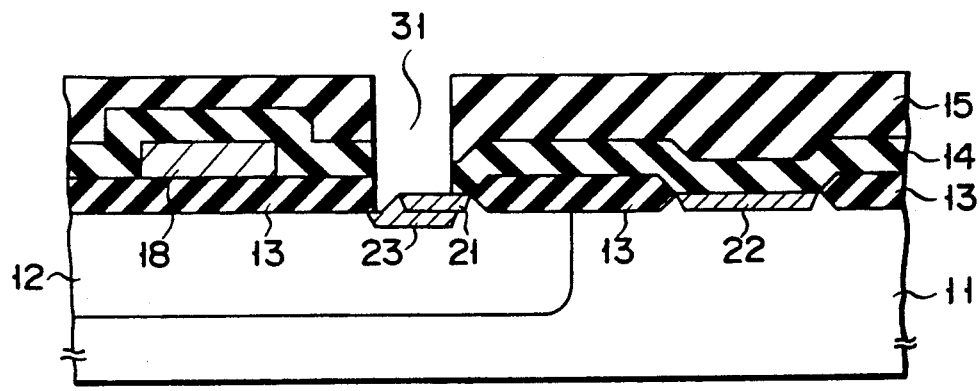
F I G. 3B
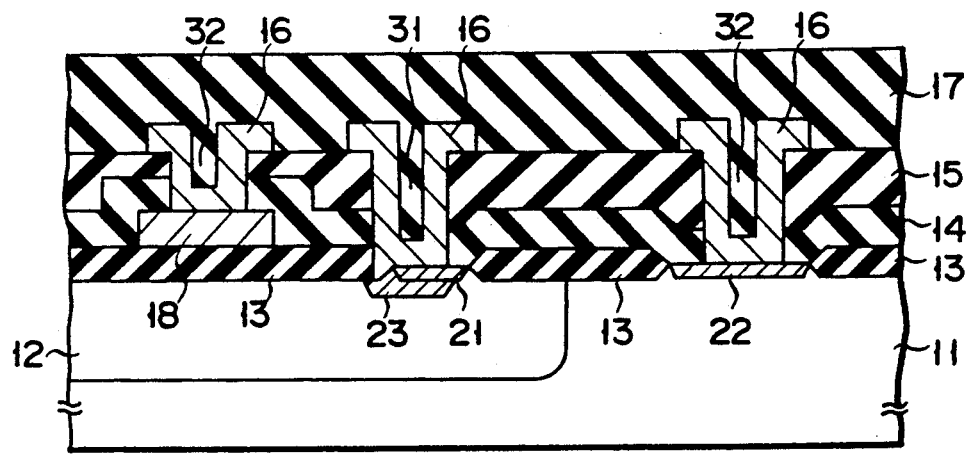
F I G. 3C

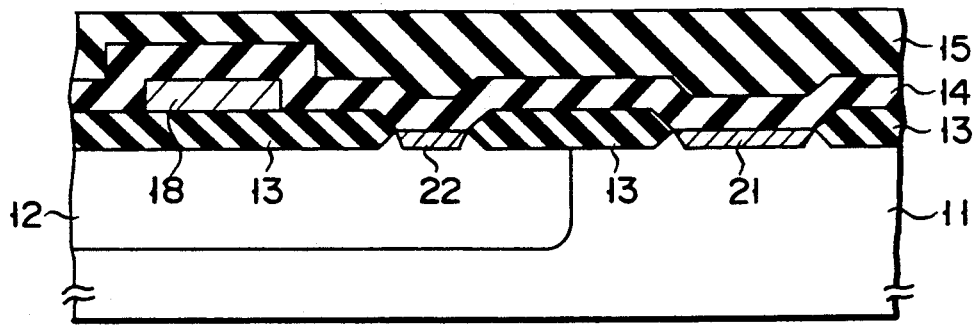
F I G. 4A
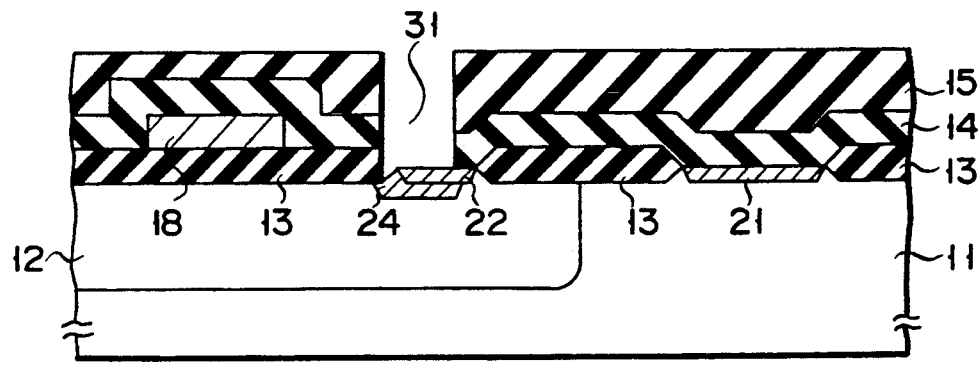
F I G. 4B
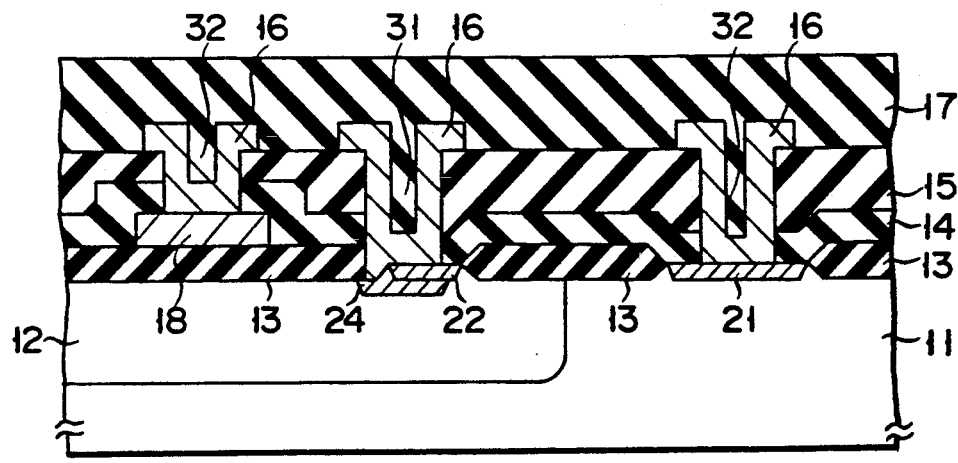
F I G. 4C

METHOD OF MANUFACTURING A SEMICONDUCTOR DEVICE

BACKGROUND OF THE INVENTION

1. Field of the Invention

The present invention relates to a method of manufacturing a semiconductor device, particularly a semiconductor device having both an N-type diffusion layer and a P-type diffusion layer.

2. Description of the Related Art

Semiconductor devices having both an N-type diffusion layer and a P-type diffusion layer are manufactured in the following way. First, both the N-type diffusion layer and the P-type diffusion layer are formed within a semiconductor substrate. Then, an inter-layer insulation layer is formed on the substrate. Next, contact holes are made in these layers using one and the same process. Finally, metal wires are formed on the substrate and in the contact holes.

In recent years, the size of the elements of a semiconductor device has been reduced, and the width of the contact holes have been reduced proportionally. The margin for the alignment of contact holes has inevitably decreased. Hence, it is proposed that the SAC (Self-Aligned-Contact) technique is employed in forming diffusion layers in a semiconductor substrate.

FIG. 1 is a graph, in which curve (a) represents the relationship between the size and resistance of a contact formed without applying the SAC technique, and curve (b) illustrates the relationship between the size and resistance of a contact formed by applying the SAC technique. As evident from curve (a), when the SAC technique is not applied, the resistance of the contact greatly increases in inverse proportion to the size thereof. By contrast, as can be understood from curve (b), when the SAC technique is applied, the resistance of the contact does not increase as much in inverse proportion to the size thereof. In view of this, it seems necessary to employ the SAC technique to manufacture next-generation semiconductor devices which have smaller elements than those of the devices manufactured and used at present.

The SAC technique can be accomplished by ion re-implantation or solid-phase impurity diffusion. When ion re-implantation or solid-phase impurity diffusion is performed on a semiconductor IC, such as a CMOS IC, comprising a substrate and an N-type and a P-type diffusion layers, both formed in the substrate, in a semiconductor substrate, and having contact holes made in the diffusion layers by the same process, the N-type impurity diffuses from the N-type diffusion layer into the P-type diffusion layer, and the P-type impurity diffuses from the P-type diffusion layer into the N-type diffusion layer. Consequently, the characteristic of the contacts formed in the contact holes is deteriorated. Further, while the SAC technique is being performed on the N-type diffusion layer, the heat treatment for activating the impurity results in so-called out-diffusion, i.e., the diffusion of the impurity from the P-type diffusion layer via a gas phase. Due to this out-diffusion the impurity concentration in the surface region of the P-type diffusion layer decreases sufficiently to deteriorate the characteristic of the contacts. Still further, during the application of the SAC technique, phosphorus is doped from the BPSG (Boron-Phosphorus Silicate Glass) film, which serves as an inter-layer insulation film, into the P-type diffusion layer. This diffusion of phosphorus also deteriorates the characteristics of the contacts.

FIGS. 2A and 2B are graphs representing the characteristics which the contacts formed in the holes of the N-type and P-type diffusion layers formed in a semiconductor substrate have after arsenic ions have been implanted into the N-type diffusion layer. More precisely, FIG. 2A represents the characteristics of the contact formed in the hole made in the N-type diffusion layer, and FIG. 2B shows the characteristics of the contact formed in the hole made in the P-type diffusion layer. As is evident from FIG. 2B, the contact formed in the hole of the P-type diffusion layer has insufficient characteristics due to the simultaneous forming of holes in the N-type and P-type diffusion layers.

SUMMARY OF THE INVENTION

Accordingly, it is the object of the present invention to provide a method of manufacturing a semiconductor device which has an N-type diffusion layer and a P-type diffusion layer, both formed on the same substrate, and has contacts with excellent characteristics.

To accomplish this object, contact holes are made in the N-type diffusion layer and the P-type diffusion layer using separate steps, not simultaneously, in the method according to the present invention. Hence, when the SAC technique is applied to the N-type diffusion layer, first a contact hole is made, first in the N-type diffusion layer, then the N-type diffusion layer is doped with an N-type impurity, and finally the substrate is heat-treated, thus activating the impurity in the N-type diffusion layer. Since no contact holes have been made in the P-type diffusion layer yet, the N-type impurity is not doped into the P-type diffusion layer through a gas phase, out-diffusion of the N-type impurity does not occur in the surface of the P-type diffusion layer, or the impurity is not doped from the inter-layer insulation film into the P-type diffusion layer. Thereafter, a contact hole is made in the P-type diffusion layer to which the SAC technique has not been applied, and contacts are formed in the holes of both the N-type diffusion layer and the P-type diffusion layer. Hence, the contact formed in the P-type diffusion layer has good characteristic.

BRIEF DESCRIPTION OF THE DRAWINGS

FIG. 1 is a graph representing the relationship between the size and resistance of a contact formed by means of the SAC technique, and also the relationship between the size and resistance of the contacts formed other than by means of the SAC technique;

FIG. 2A is a graph representing the characteristic of a contact formed in the hole of an N-type diffusion layer, in the method wherein contact holes are simultaneously made in the N-type diffusion layer and a P-type diffusion layer, and arsenic ions are implanted again into the N-type diffusion layer;

FIG. 2B is a graph representing the characteristic of a contact formed in the hole of a P-type diffusion layer, in the method wherein contact holes are simultaneously made in the P-type diffusion layer and an N-type diffusion layer, and arsenic ions are implanted again into the N-type diffusion layer;

FIGS. 3A to 3C are cross-sectional views of a semiconductor device being made by the method according to a first embodiment of the present invention;

FIGS. 4A to 4C are cross-sectional views of a semiconductor device being manufactured by the method according to a second embodiment of the invention;

DETAILED DESCRIPTION OF THE PREFERRED EMBODIMENTS

Figure 5A:
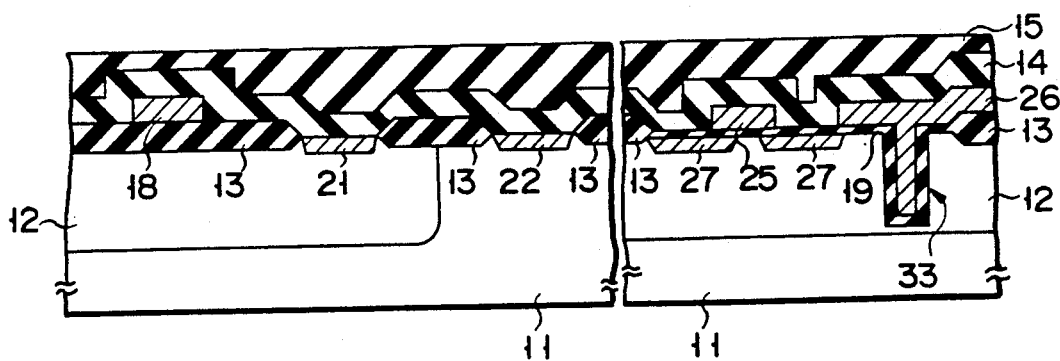
FIGS. 5A to 5C are cross-sectional views of a semiconductor device being made by the method according to a third embodiment of the invention.

Methods of manufacturing a semiconductor device, according to the present invention, will now be described with reference to the accompanying drawings.

The first method according to the invention will be explained, with reference to FIGS. 3A to 3C which are cross-sectional views of a semiconductor device being made by a first method in accordance with the present invention.

First, as is illustrated in FIG. 3A, well-shaped, P-type diffusion layer 12 is formed in the surface of N-type semiconductor substrate 11. Then, LOCOS method is applied, thereby forming element-isolating insulation film 13 on substrate 11. Next, polysilicon wiring strip 18 is formed on film 13. Ions of arsenic, As+, are implanted into well-shaped, P-type diffusion layer 12 through an opening in insulation film 13, a dose of $5 \times 10^{15}$ cm$^{-2}$ under an acceleration voltage of 40 KeV, thus forming N-type diffusion layer 21 on well-shaped P-type diffusion layer 12. Ions of boron fluoride, BF$_2$+, are implanted into N-type substrate 11 through an opening of insulation film 13, at dose of $5 \times 10^{15}$ cm$^{-2}$ under an acceleration voltage of 50 KeV, thereby forming P-type diffusion layer 22 in N-type substrate 11.

Next, silicon oxide film 14, which is used as interlayer insulation film, is formed on the surface of the entire structure, by means of CVD method. Further, insulation film 15 having a high impurity concentration, which can re-flow at low temperatures, e.g., a BPSG (Boron-Phosphorus Silicate Glass) film, is formed on the silicon oxide film 14, also by means of the CVD method. Next, the structure is annealed at 900° C. for 30 minutes, thereby smoothening the surface of insulation film 15.

Next, as is shown in FIG. 3B, contact hole 31 is made in silicon oxide film 14 and insulation film 15, by means of anisotropic etching by using a mask (not shown), thus exposing N-type diffusion layer 21. Then, ions of arsenic, As+, are implanted into N-type diffusion layer 21, at dose of $5 \times 10^{15}$ cm$^{-2}$ under an acceleration voltage of, for example, 40 KeV. Further, the structure is annealed at 850° C. for 30 minutes, thereby forming N-type diffusion layer 23. In other words, layer 23 is formed by the SAC technique.

Next, as is illustrated in FIG. 3C, two contact holes 32 are made in oxide film 14 and insulation film 15, thus exposing polysilicon wiring strip 18 and P-type diffusion layer 22, by means of anisotropic etching by using a mask which covers contact hole 31. Then, an Al-Cu-Si alloy layer is deposited on the entire surface of the structure, by means of sputtering. The Al-Cu-Si alloy layer is subjected to patterning, forming electrodes 16 connected to wiring strip 18, P-type diffusion layer 22, and N-type diffusion layers 21 and 23. Then, inter-layer insulation film 17 is formed on the entire surface of the structure.

The second method according to the invention will be explained, with reference to FIGS. 4A to 4C which are cross-sectional views of a semiconductor device being made by a second method in accordance with the present invention.

First, as is illustrated in FIG. 4A, well-shaped, N-type diffusion layer 12 is formed in the surface of P-type semiconductor substrate 11. Then, LOCOS method is applied, thereby forming element-isolating insulation film 13 on substrate 11. Next, polysilicon wiring strip 18 is formed on film 13. Ions of boron fluoride, BF$_2$+ are implanted into well-shaped, N-type diffusion layer 12 through an opening in insulation film 13, at a dose of $5 \times 10^{15}$ cm$^{-2}$ under an acceleration voltage of 50 KeV, thus forming P-type diffusion layer 22 on well-shaped N-type diffusion layer 12. Ions of arsenic, As+ are implanted into P-type substrate 11 through an opening in insulation film 13, at a dose of $5 \times 10^{15}$ cm$^{-2}$ under an acceleration voltage of 40 KeV, thereby forming N-type diffusion layer 21 in P-type substrate 11.

Next, silicon oxide film 14, which is used as interlayer insulation film, is formed on the surface of the entire structure, by means of CVD method. Further, insulation film 15 having a high impurity concentration, which can re-flow at low temperatures, e.g., a BPSG (Boron-Phosphorus Silicate Glass) film, is formed on the silicon oxide film 14, also by means of the CVD method. Next, the structure is annealed at 900° C. for 30 minutes, thereby smoothening the surface of insulation film 15.

Next, as is shown in FIG. 4B, contact hole 31 is made in silicon oxide film 14 and insulation film 15, by means of anisotropic etching by using a mask (not shown), thus exposing P-type diffusion layer 22. Then, ions of boron fluoride, BF$_2$+ are implanted into P-type diffusion layer layer 22, at a dose of $5 \times 10^{15}$ cm$^{-2}$ under an acceleration voltage of, for example, 40 KeV. Further, the structure is annealed at 850° C. for 30 minutes, thereby forming P-type diffusion layer 24. In other words, layer 24 is formed by the SAC technique.

Next, as is illustrated in FIG. 4C, two contact holes 32 are made in oxide film 14 and insulation film 15, thus exposing polysilicon wiring strip 18 and N-type diffusion layer 21, by means of anisotropic etching by using a mask which covers contact hole 31. Then, an Al-Cu-Si alloy layer is deposited on the entire surface of the structure, by means of sputtering. The Al-Cu-Si alloy layer is subjected to patterning, forming electrodes 16 connected to wiring strip 18, N-type diffusion layer 21, and P-type diffusion layers 22 and 24. Then, inter-layer insulation film 17 is formed on the entire surface of the structure.

The third method according to the invention will now be explained, with reference to FIGS. 5A to 5C which are cross-sectional views of a semiconductor device being manufactured by this method.

First, as is shown in FIG. 5A, well-shaped, P-type diffusion layer 12 is formed in N-type semiconductor substrate 11. Next, element-isolating insulation film 13 is formed on substrate 11 by means of the LOCOS method. Then, trench 33, in which a capacitor is formed, is made in a memory cell region of P-type diffusion layer 12. Gate oxide film 19 is formed on the memory cell region by means of thermal oxidation. Further, polysilicon wiring strip 18, gate electrode 26 for the switching transistor of a memory cell, and gate electrode 26 for the capacitor are formed. Next, ions of arsenic, As+, are implanted into well-shaped, P-type diffusion layer 12 through the openings in insulation film 13, at a dose of $5\times10^{15}$ cm$^{-2}$ under an acceleration voltage of 40 KeV, thus forming N-type diffusion layer 21 on P-type diffusion layer 12, and also forming N-type diffusion layers 27 on the element region of P-type diffusion layer 12. Then, ions of boron fluoride, BF$_2^+$, are implanted into N-type substrate 11 through an opening in insulation film 13, at a dose of $5\times10^{15}$ cm$^{-2}$ under an acceleration voltage of 50 KeV, thus forming P-type diffusion layer 22 on substrate 11.

Thereafter, silicon oxide film 14, which functions as an inter-layer insulation film, is formed on the surface of the entire structure, by means of CVD method. Further, insulation film 15 having a high impurity concentration, which can re-flow at low temperatures, e.g., a BPSG (Boron-Phosphorus Silicate Glass) film, is formed on the silicon oxide film 14, also by means of the CVD method. Next, the structure is annealed at 900° C. for 30 minutes, thereby smoothening the surface of insulation film 15.

Figure 5B:
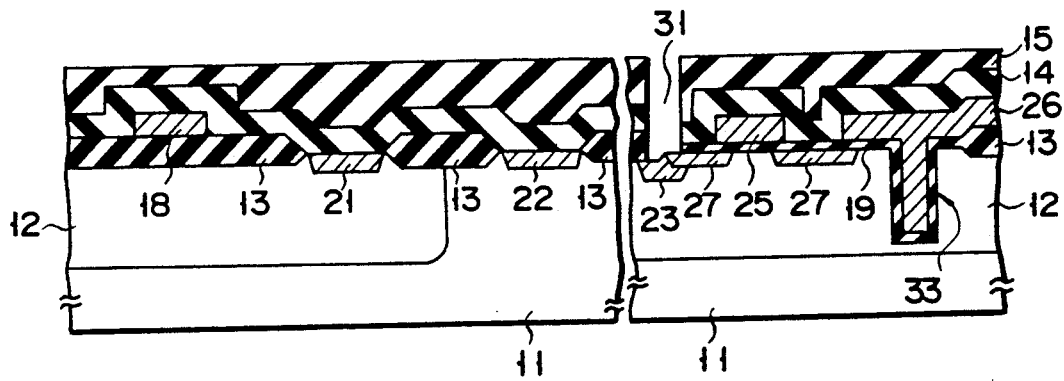

Next, as is shown in FIG. 5B, contact hole 31 is made in silicon oxide film 14 and insulation film 15, by means of anisotropic etching by using a mask (not shown), thus exposing N-type diffusion layer 27 of the switching transistor. Then, ions of arsenic, As$^+$ are implanted, through this hole 31 into N-type diffusion layer 21, at a dose of $5\times10^{15}$ cm$^{-2}$ under an acceleration voltage of, for example, 40 KeV. Further, the structure is annealed at 850° C. for 30 minutes, thereby forming N-type diffusion layer 23. In other words, layer 23 is formed by the SAC technique.

Figure 5C:
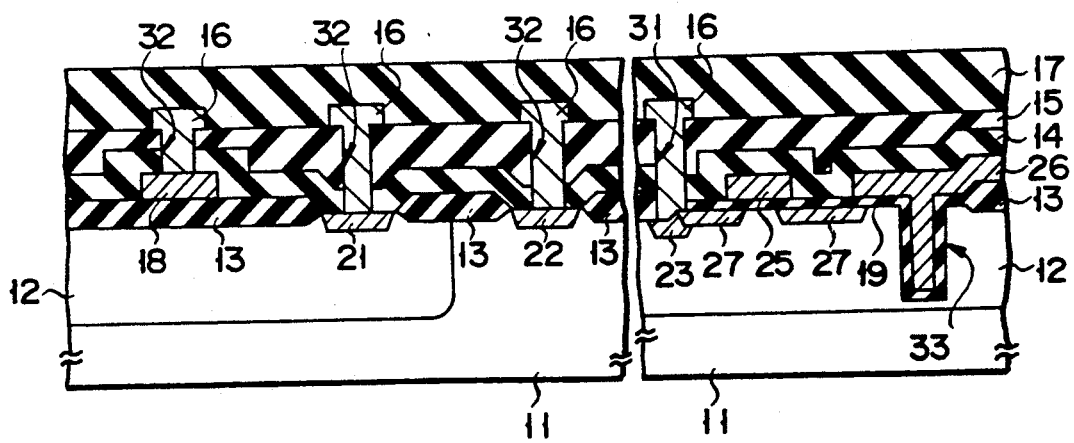

Next, as is illustrated in FIG. 5C, three contact holes 32 are made in oxide film 14 and insulation film 15, thus exposing polysilicon wiring strip 18, N-type diffusion layer 21, and P-type diffusion layer 22, by means of anisotropic etching by using a mask which covers contact hole 31. Then, an Al-Cu-Si alloy layer is deposited on the entire surface of the structure, by means of sputtering. The Al-Cu-Si alloy layer is subjected to patterning, forming electrodes 16 connected to wiring strip 18, N-type diffusion layer 21, P-type diffusion layer 22, and N-type diffusion layers 23 and 27. Then, inter-layer insulation film 17 is formed on the entire surface of the structure.

The fourth method according to the invention will now be explained, with reference to FIGS. 6A to 6C which are cross-sectional views of a semiconductor device being manufactured by this method.

Figure 6A:
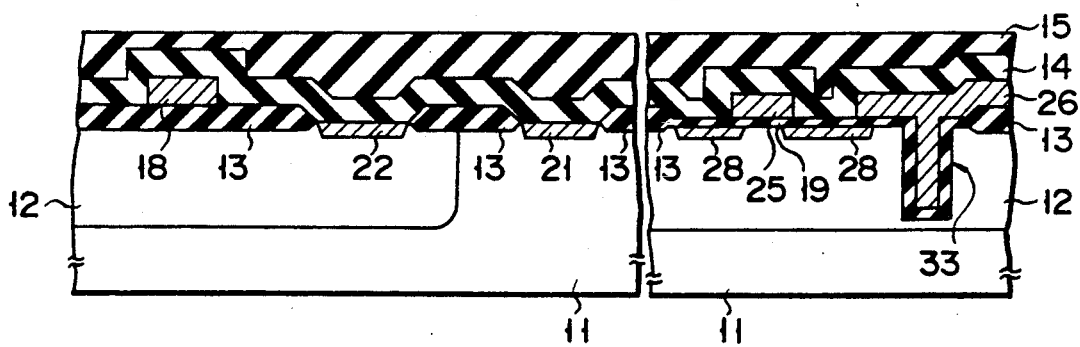
FIGS. 6A to 6C are cross-sectional views of a semiconductor device being manufactured by the method according to a fourth embodiment of the present invention.

First, as is shown in FIG. 6A, well-shaped, N-type diffusion layer 12 is formed in P-type semiconductor substrate 11. Next, element-isolating insulation film 13 is formed on substrate 11 by means of the LOCOS method. Then, trench 33, in which a capacitor is formed, is made in a memory cell region of N-type diffusion layer 12. Gate oxide film 19 is formed on the memory cell region by means of thermal oxidation. Further, polysilicon wiring strip 18, gate electrode 26 for the switching transistor of a memory cell, and gate electrode 26 for the capacitor are formed. Next, ions of boron fluoride, BF$_2^+$ are implanted into well-shaped N-type diffusion layer 12 through the openings of insulation film 13, at a dose of $5\times10^{15}$ cm$^{-2}$ under an acceleration voltage of 50 KeV, thus forming P-type diffusion layer 22 on P-type diffusion layer 12, and also forming P-type diffusion layers 28 on the element region of N-type diffusion layer 12. Then, ions of arsenic, As$^+$, are implanted into P-type substrate 11 through an opening in insulation film 13, at dose of $5\times10^{15}$ cm$^{-2}$ under an acceleration voltage of 40 KeV, thus forming N-type diffusion layer 21 on substrate 11.

Thereafter, silicon oxide film 14, which functions as an inter-layer insulation film, is formed on the surface of the entire structure, by means of CVD method. Further, insulation film 15 having a high impurity concentration, which can re-flow at low temperatures, e.g., a BPSG (Boron-Phosphorus Silicate Glass) film, is formed on the silicon oxide film 14, also by means of the CVD method. Next, the structure is annealed at 900° C. for 30 minutes, thereby smoothening the surface of insulation film 15.

Figure 6B:
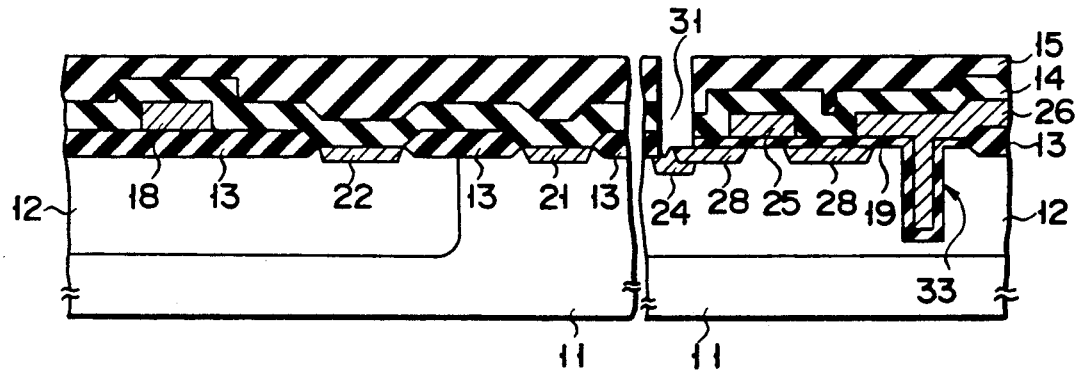
Figure 6C:
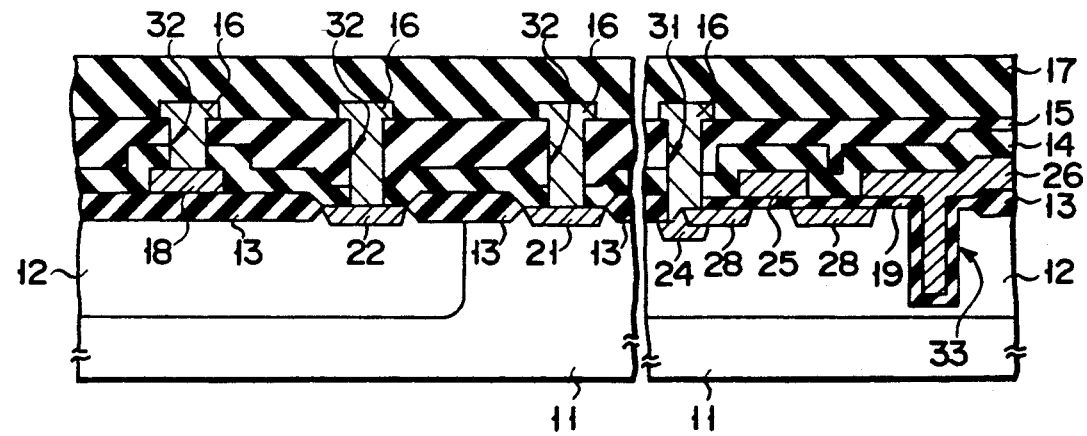

Next, as is shown in FIG. 6B, contact hole 31 is made in silicon oxide film 14 and insulation film 15, by means of anisotropic etching by using a mask (not shown), thus exposing P-type diffusion layer 28 of the switching transistor. Then, ions of boron fluoride, BF$_2^+$ are implanted through this hole 31 into N-type diffusion layer 21, at a dose of $5\times10^{15}$ cm$^{-2}$ under an acceleration voltage of, for example, 40 KeV. Further, the structure is annealed at 850° C. for 30 minutes, thereby forming P-type diffusion layer 24. In other words, layer 24 is formed by the SAC technique. Next, as is illustranted in FIG. 6C, holes 32 are made in oxide film 14 and insulation film 15, thus exposing polysilicon wiring strip 18, P-type diffusion layer 22, and N-type diffusion layer 21, by means of anisotropic etching by using a mask which covers contact hole 31. Then, an Al-Cu-Si alloy layer is deposited on the entire surface of the structure, by means of sputtering. The Al-Cu-Si alloy layer is subjected to patterning, forming electrodes 16 connected to wiring strip 18, P-type diffusion layer 22, N-type diffusion layer 21, and P-type diffusion layers 24 and 28. Then, inter-layer insulation film 17 is formed on the entire surface of the structure.

In any method according to the invention, a contact hole is made in a step exposing a diffusion layer to which the SAC technique is applied, and contact holes are then made by another step by using a mask covering the first contact hole, thus exposing the other diffusion layers to which the SAC technique is not applied. Hence, the impurity doped through the contact hole first made does not diffuse through the contact holes made later into the layers to which the SAC technique is not applied. Further, no out-diffusion takes place in the layers to which the SAC technique is not applied. Also, diffusion of an undesired impurity from the inter-layer insulation film into the diffusion layers does not occur.

In the embodiments described above, the SAC technique is applied to only one diffusion layer. Nonetheless, the present invention can apply to methods wherein the SAC technique is applied to any diffusion layers, or to methods wherein the SAC technique is not applied at all.

We claim:

1. A method of manufacturing a MOS semiconductor device having a semiconductor substrate of a first conductivity type, comprising:
    a first step of forming a well region of a second conductivity type in said substrate;
    a second step of forming a diffusion layer of the second conductivity type in said substrate and diffusion layers of the first conductivity type serving as source and drain of a MOS transistor in said well region;

a third step of forming a insulation film covering said diffusion layers of the first and second conductivity types, and forming a gate of said MOS transistor;

a fourth step of making a first contact hole in said insulation film, thereby exposing one of said diffusion layers;

a fifth step of covering the first contact hole with a mask member, and subsequently making a second contact hole in said insulation film, thereby exposing said diffusion layer having a conductivity type different from that of said diffusion layer exposed by said fourth step.

2. The method according to claim 1, further comprising the step of heat-treating at least one of the diffusion layers exposed through said contact hole.

3. The method according to claim 1, further comprising the steps of:

doping at least one of said diffusion layers with an impurity of the same conductivity type as that of said at least one of the diffusion layers; and heat-treating said at least one of the diffusion layers.

4. A method of manufacturing a semiconductor device having a semiconductor substrate of a first conductivity type, at least one N-type diffusion layer formed in the substrate, and at least one P-type diffusion layer formed in the substrate, said method comprising:

a first step of forming a well-shaped diffusion layer of a second conductivity type in said substrate, forming an element-isolating insulation film on said substrate to isolate portions of said substrate from each other and forming a wiring strip on the element-isolating insulation film;

a second step of forming a N-type diffusion layer and a P-type diffusion layer in those portions of said substrate which are isolated from each other by said element-isolating insulation film;

a third step of forming a first insulation film covering said N-type diffusion layer, said P-type diffusion layer, and said wiring strip, and forming a second insulation film on the first insulation film;

a fourth step of making a first contact hole in said insulation films, thereby exposing one of said diffusion layers; and a fifth step of covering the first contact hole with a mask member, and subsequently making a second contact hole in said insulation films, thereby exposing said diffusion layer having a conductivity type different from that of said diffusion layer exposed by said fourth step and also said wiring strip.

5. The method according to claim 4, further comprising the step of performing heat treatment on at least one of the diffusion layers exposed through the contact holes.

6. The method according to claim 4, further comprising the steps of:

doping at least one of the diffusion layers with an impurity of the same conductivity type as that of said at least one diffusion layer; and performing heat treatment on said at least one diffusion layer.

7. The method according to claim 4, wherein said first step includes the step of forming a well-shaped, P-type diffusion layer in an N-type semiconductor substrate, the step of forming an element-isolating insulation film on said N-type semiconductor substrate, and the step of forming a polysilicon wiring strip; said second step includes the step of implanting ions of arsenic into said N-type semiconductor substrate through an opening of the element-isolating insulation film, thereby forming an N-type diffusion layer, and the step of implanting ions of boron fluoride into said N-type semiconductor substrate through an opening of the element-isolating insulation film, thereby forming a P-type diffusion layer; said third step includes the step of depositing silicon oxide film used as an inter-layer insulation film, and insulation film which has a high impurity concentration and which can re-flow at low temperatures, and then annealing the entire structure of the device, thereby smoothening the surface thereof; and said fourth step includes making a first contact hole in said insulation films, thereby exposing N-type diffusion layer by means of anisotropic etching, implanting ions of arsenic into said N-type diffusion layer, and annealing the entire structure of the device, thereby forming an N-type diffusion layer by means of self-aligned-contact technique; and said fifth step includes step of making second contact holes in said insulation films by means of anisotropic etching by using a mask member covering the first contact hole, thus exposing the P-type diffusion layer and the polysilicon wiring strip, depositing an Al-Cu-Si alloy layer in the contact holes and on the entire surface of the structure, patterning the Al-Cu-Si alloy layer, thereby forming electrodes, and forming an inter-layer insulation film on the entire surface of the structure.

8. The method according to claim 4, wherein said first step includes the step of forming a well-shaped, N-type diffusion layer in a P-type semiconductor substrate, the step of forming an element-isolating insulation film on said P-type semiconductor substrate, and the step of forming a polysilicon wiring strip; said second step includes the step of implanting ions of boron fluoride into said P-type semiconductor substrate through an opening of the element-isolating insulation film, thereby forming a P-type diffusion layer, and the step of implanting ions of arsenic into said P-type semiconductor substrate through an opening in the element-isolating insulation film, thereby forming an N-type diffusion layer; said third step includes the step of depositing silicon oxide film used as an inter-layer insulation film, and insulation film which has a high impurity concentration and which can re-flow at low temperatures, and then annealing the entire structure of the device, thereby smoothening the surface thereof; and said fourth step includes making a first contact hole in said insulation films, thereby exposing said P-type diffusion layer by means of anisotropic etching, implanting ions of boron fluoride into said P-type diffusion layer, and annealing the entire structure of the device, thereby forming a P-type diffusion layer by means of self-aligned-contact technique; and said fifth step includes step of making second contact holes in said insulation films by means of anisotropic etching by using a mask member covering the first contact hole, thus exposing the N-type diffusion layer and the polysilicon wiring strip, depositing an Al-Cu-Si alloy layer in the contact holes and on the entire surface of the structure, patterning the Al-Cu-Si alloy layer, thereby forming electrodes, and forming an inter-layer insulation film on the entire surface of the structure.

9. The method according to claim 4, wherein said first step includes the step of forming a well-shaped, P-type diffusion layer in an N-type semiconductor substrate, the step of forming an element-isolating insulation film on said N-type semiconductor substrate, the step of forming a trench in a memory-cell region of the P-type diffusion layer, the step of forming gate oxide film by means of thermal oxidation, and the step of forming a gate electrode of a switching transistor of a memory cell and a gate electrode of a capacitor of the memory cell; said second step includes the step of implanting ions of arsenic into said N-type semiconductor substrate through openings of the element-isolating insulation film, thereby forming an N-type diffusion layer, and the step of implanting ions of boron fluoride into said N-type semiconductor substrate through an opening of the element-isolating insulation film, thereby forming a P-type diffusion layer; said third step includes the step of depositing silicon oxide film used as an inter-layer insulation film, and insulation film which has a high impurity concentration and which can re-flow at low temperatures, and then annealing the structure of the device, thereby smoothening the surface thereof; and said fourth step includes making a first contact hole in said insulation films, thereby exposing said N-type diffusion layer by means of anisotropic etching, implanting ions of arsenic into said N-type diffusion layer, and annealing the entire structure of the device, thereby forming an N-type diffusion layer by means of self-aligned-contact technique; and said fifth step includes step of making second contact holes in said insulation films by means of anisotropic etching by using a mask member covering the first contact hole, thus exposing the N-type diffusion layer, the P-type diffusion layer and the polysilicon wiring strip, depositing an Al-Cu-Si alloy layer in the contact holes and on the entire surface of the structure, patterning the Al-Cu-Si alloy layer, thereby forming electrodes, and forming an inter-layer insulation film on the entire surface of the structure.

10. The method according to claim 4, wherein said first step includes the step of forming a well-shaped, N-type diffusion layer in an P-type semiconductor substrate, the step of forming an element-isolating insulation film on said P-type semiconductor substrate, the step of forming a trench in a memory-cell region of the N-type diffusion layer, the step of forming gate oxide film by means of thermal oxidation, and the step of forming a gate electrode of a switching transistor of a memory cell and a gate electrode of a capacitor of the memory cell; said second step includes the step of implanting ions of boron fluoride into said P-type semiconductor substrate through openings in the element-isolating insulation film, thereby forming a P-type diffusion layer, and the step of implanting ions of arsenic into said P-type semiconductor substrate through an opening of the element-isolating insulation film, thereby forming an N-type diffusion layer; said third step includes the step of depositing silicon oxide film used as an inter-layer insulation film, and insulation film which has a high impurity concentration and which can re-flow at low temperatures, and then annealing the entire structure of the device, thereby smoothening the surface thereof; and said fourth step includes making a first contact hole in said insulation films, thereby exposing said P-type diffusion layer by means of anisotropic etching, implanting ions of boron fluoride into said P-type diffusion layer, and annealing the entire structure of the device, thereby forming a P-type diffusion layer by means of self-aligned-contact technique; and said fifth step includes step of making second contact holes in said insulation films by means of anisotropic etching by using a mask member covering the first contact hole, thus exposing the N-type diffusion layer, the P-type diffusion layer, and the polysilicon wiring strip, depositing an Al-Cu-Si alloy layer in the contact holes and on the entire surface of the structure, patterning the Al-Cu-Si alloy layer, thereby forming electrodes, and forming an inter-layer insulation film on the entire surface of the structure.

* * * * *

UNITED STATES PATENT AND TRADEMARK OFFICE
CERTIFICATE OF CORRECTION

PATENT NO. : 5,106,782
DATED : April 21, 1992
INVENTOR(S) : Tadashi Matsuno et al.

It is certified that error appears in the above-indentified patent and that said Letters Patent is hereby corrected as shown below:

Claim 1, column 7, line 1, before "insulation" change "a" to --an--.

Claim 4, column 7, line 33, before "N-type" change "a" to --an--.

Claim 7, column 8, line 18, after "means of" insert --a--.

Claim 8, column 8, line 53, after "means of" insert --a--.

UNITED STATES PATENT AND TRADEMARK OFFICE
CERTIFICATE OF CORRECTION

PATENT NO. : 5,106,782
DATED : April 21, 1992
INVENTOR(S) : Tadashi Matsuno et al.

It is certified that error appears in the above-indentified patent and that said Letters Patent is hereby corrected as shown below:

Claim 9, column 9, line 24, after "means of" insert --a--.

Claim 10, column 9, line 37, before "P-type" change "an" to --a--.

Claim 10, column 10, line 26, after "means of" insert --a--.

Signed and Sealed this

Twenty-third Day of November, 1993

Attest:

BRUCE LEHMAN

Attesting Officer  Commissioner of Patents and Trademarks